United States Patent
Yeh et al.

(10) Patent No.: US 12,396,190 B2
(45) Date of Patent: Aug. 19, 2025

(54) GaN DEVICE WITH N2 PRE-TREATMENT AND METHOD OF PERFORMING $N_2$ PRE-TREATMENT

(71) Applicant: Powerchip Semiconductor Manufacturing Corporation, Hsinchu (TW)

(72) Inventors: Po-Hsien Yeh, Taichung (TW); Jih-Wen Chou, Hsinchu (TW); Hwi-Huang Chen, Hsinchu (TW); Hsin-Hong Chen, Hsinchu (TW); Yu-Jen Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 387 days.

(21) Appl. No.: 18/139,945

(22) Filed: Apr. 26, 2023

(65) Prior Publication Data

US 2024/0282841 A1    Aug. 22, 2024

(30) Foreign Application Priority Data

Feb. 22, 2023 (TW) ................. 112106501

(51) Int. Cl.
*H01L 29/66* (2006.01)
*H01L 21/223* (2006.01)
*H10D 30/01* (2025.01)
*H10D 30/47* (2025.01)
*H01L 21/02* (2006.01)
*H01L 23/29* (2006.01)
*H01L 23/31* (2006.01)

(52) U.S. Cl.
CPC ....... *H10D 30/015* (2025.01); *H01L 21/2233* (2013.01); *H01L 21/2236* (2013.01); *H10D 30/475* (2025.01); *H01L 21/022* (2013.01); *H01L 23/291* (2013.01); *H01L 23/3171* (2013.01); *H01L 23/3192* (2013.01)

(58) Field of Classification Search
CPC .. H10D 30/015; H10D 30/475; H10D 62/343; H10D 62/8503; H01L 21/2233; H01L 21/2236; H01L 21/022; H01L 23/291; H01L 23/3171; H01L 23/3192
See application file for complete search history.

(56) References Cited

FOREIGN PATENT DOCUMENTS

TW    201145403 A1    12/2011
TW    202145345 A     12/2021

*Primary Examiner* — Elmito Breval
(74) *Attorney, Agent, or Firm* — Winston Hsu

(57) ABSTRACT

A GaN device with $N_2$ pre-treatment is provided in the present invention, including a GaN substrate, an AlGaN layer covering the GaN substrate, a p-GaN gate on the AlGaN layer, a TiN electrode on the p-GaN gate, a first dielectric layer on the AlGaN layer surrounding the p-GaN gate, wherein a horizontal spacing is between the first dielectric layer and the p-GaN gate, and an interface between the AlGaN layer and the GaN substrate not covered by the first dielectric layer is subject to $N_2$ pre-treatment, and a second dielectric layer covering on and directly contacting the exposed first dielectric layer, AlGaN layer, p-GaN gate and TiN electrode.

12 Claims, 3 Drawing Sheets

GaN DEVICE WITH N2 PRE-TREATMENT AND METHOD OF PERFORMING N₂ PRE-TREATMENT

BACKGROUND OF THE INVENTION

1. Field of the Invention

The present invention relates generally to a gallium nitride (GaN) device, and more specifically, to a GaN device with N₂ pre-treatment and method of performing N₂ pre-treatment.

2. Description of the Prior Art

Most of semiconductor devices currently available in the world are silicon-based semiconductor using silicon as their substrate and channel. However, in the application of high-temperature, high-voltage, and high-power devices, silicon-based devices may suffer high power consumption since their on-state resistance $R_{DS}$ (on) is too large. Furthermore, in high-frequency operation, silicon-based device has relatively lower switch frequency, thus its performance is no match for those using wide-bandgap compound semiconductor material like gallium nitride (GaN) or silicon carbide (SiC). In comparison to conventional silicon-based material, Wide-bandgap compound semiconductor material like GaN is provided with larger bandgap, lower on-state resistance, thus it is more durable and applicable in high temperature, high voltage, high frequency and high current applications, and also with better energy conversion efficiency. Thus, GaN device is provided all kinds of excellent properties required in the semiconductor device like good heat dissipation, small size, lower power consumption and high power, which is suitable for the application of power semiconductor. With the urgent demand in high-end industry like 5G communication and electric car, GaN material has emerged to be a promising candidate of the third generation semiconductor materials in the future.

There are primarily two modes of GaN device, i.e. depletion mode (D-mode) and enhancement mode (E-mode). With respect to D-mode GaN device, since a conductive channel of high concentration two-dimensional electron gas (2DEG) will be formed at the heterojunction between AlGaN/GaN layers s due to spontaneous polarization and piezoelectric polarization effect, the D-mode GaN device is normally-on without applying gate voltage, while E-mode device realizes its normally-off characteristic through setting an additional positively charged p-type GaN (p-GaN) layer on the aforementioned AlGaN layer to achieve the purpose of depleting the 2DEG channel below. The aforementioned two modes of GaN devices have their advantages, disadvantages and their suitable applications.

In conventional skill, E-mode GaN device usually suffers abnormal hump effect of $I_d$-$V_{gs}$ (drain current versus gate-source voltage) curve. This effect may change the switch property of the device and cause the shift of gate threshold voltage. Accordingly, those skilled in the art need to improve current process and structure of GaN device in order to solve this problem.

SUMMARY OF THE INVENTION

In light of the aforementioned problem encountered in conventional skill, the present invention hereby provides a novel structure and process of GaN device, with feature of performing N₂ pre-treatment to GaN devices in the process to solve abnormal hump effect of $I_d$-$V_{gs}$ (drain current versus gate-source voltage) curve, and a patterned dielectric mask is used specifically in this step to define the treatment regions thereof, so that only gates and their surrounding regions will be subject to the N₂ pre-treatment, thereby avoiding excess nitrogen ions introduced into heterogeneous interface of non-gate region, which may cause the reduction of 2DEG (two-dimensional electron gas) channel density and the increase of channel resistance.

One aspect of the present invention is to provide a GaN device with N₂ pre-treatment, with structures including a GaN substrate, an AlGaN layer covering the GaN substrate, a p-GaN gate on the AlGaN layer, a TiN electrode on the p-GaN gate, a first dielectric layer on the AlGaN layer around the p-GaN gate, wherein a horizontal spacing is between the first dielectric layer and the p-GaN gate, and the interface between the AlGaN layer and the GaN substrate not covered by the first dielectric layer is subject to a N₂ pre-treatment, and a second dielectric layer covering and directly contacting the exposed first dielectric layer, AlGaN layer, p-GaN gate and the TiN electrode.

Another aspect of the present invention is to provide a GaN device with N₂ pre-treatment, with steps including providing a GaN device having a GaN substrate, an AlGaN layer covering the GaN substrate, a p-GaN gate on the AlGaN layer and a TiN electrode on the p-GaN gate, forming a conformal first dielectric layer on the AlGaN layer, p-GaN gate and the TiN electrode, forming a photoresist on the first dielectric layer, the photoresist is provided with an opening completely overlapping the p-GaN gate in a direction vertical to the GaN substrate, wherein a horizontal spacing is between sidewalls of the opening and the p-GaN gate, performing an etching process to remove the first dielectric layer exposed from the photoresist, removing the photoresist, and using remaining first dielectric layer as a mask to perform a N₂ pre-treatment to the interface between the AlGaN layer and the GaN substrate not covered by the first dielectric layer.

These and other objectives of the present invention will no doubt become obvious to those of ordinary skill in the art after reading the following detailed description of the preferred embodiment that is illustrated in the various figures and drawings.

Figure 1:
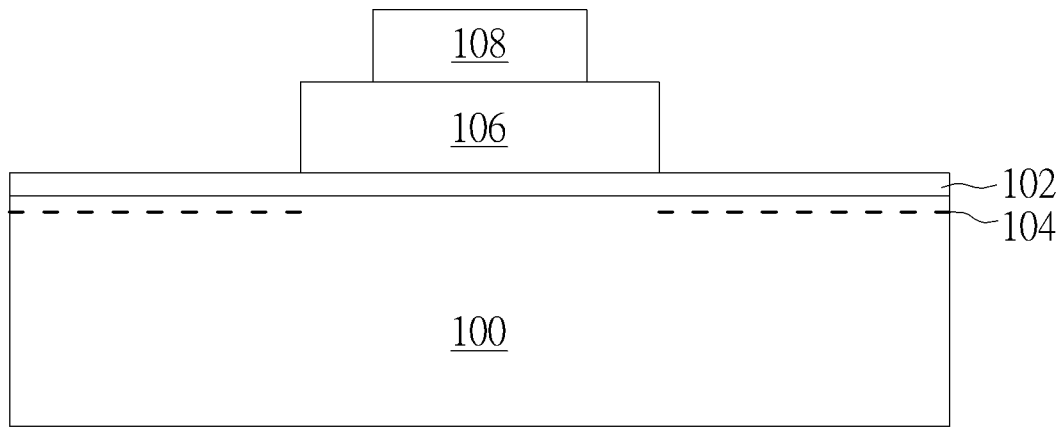
FIG. 1 to FIG. 6 are schematic cross-sectional views illustrating a process flow of performing a N₂ pre-treatment to a GaN device in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 to FIG. 6 will now be referred sequentially hereinafter to describe the process flow of performing a $N_2$ pre-treatment to a gallium nitride (GaN) device, wherein relative positions and connections between components in vertical direction in the process are illustrated in the manner of cross-sections, and an enhancement mode (E-mode) GaN device is exemplified in the figures to provide readers a better understanding of the progress and relation of the components therein. However, please note that in actual structure, GaN device may be consisted of different structures depending on the position and range where the cross-sections are taken, for example, whether there are active areas or shallow trench isolations (STIs) in the substrate and if there are contacts or metal electrodes formed thereon, and there might be multiple gates arranged in strip form, but not limited.

Please refer to FIG. 1. In the beginning of process, a GaN substrate 100 is provided as a basis for forming the semiconductor device. In the embodiment of present invention, a GaN substrate 100 may be formed on a silicon wafer (not shown) through heteroepitaxy, with structures like buffer layers or superlattice layers therebetween for reducing lattice dislocations and defects. For the conciseness of drawings, only layer structures above the GaN substrate 100 are shown in the figures. An aluminium gallium nitride (AlGaN) layer 102 is formed on the GaN substrate 100, which covers entire surface of the GaN substrate 100. Similarly, the AlGaN layer 102 may be formed through epitaxy, and a heterogeneous interface with band gap discontinuity is formed between the AlGaN layer 102 and GaN substrate 100, so that electrons formed in the AlGaN layer 102 through piezoelectricity would fall into the GaN substrate 100 and produce an electron thin-film with high mobility and conductivity, ex. two-dimension electron gas (2DEG) channel 104, in a position adjacent to the interface therebetween.

Refer still to FIG. 1. In order to manufacture an E-mode GaN device with normally-off property, a positively charged p-type GaN (p-GaN) gate 106 is further set on the AlGaN layer 102 to achieve the purpose of depleting the 2DEG channel 104 below. The p-GaN gate 106 may be formed by first forming a p-GaN layer through epitaxy and then performing a photolithography process to pattern it. The p-GaN gate 106 may have fixed doping concentration, with example of p-type dopants like but not limited to carbon (C), iron (Fe), magnesium (Mg) or Zinc (Zn). In actual implementation, GaN substrate 100, AlGaN layer 102 and p-GaN gate 106 may be in-situ formed in the same process chamber through successive heteroepitaxy without transferring to other chambers, thereby reducing production cost and process pollution. In the preferred embodiment of present invention, a TiN electrode 108 is further formed on the p-GaN gate 106, which may function as an etch hard mask used in the step of patterning the p-GaN layer and may provide good Schottky contact for the p-GaN gate 106 and contacts formed in later process. In the embodiment, the horizontal width of TiN electrode 108 may be smaller than the width of p-GaN gate 106 below due to lateral etching. Please note that, in addition to the aforementioned p-GaN gate 106 and TiN electrode 108, structures like source and drain (not shown) may be further formed on the GaN substrate 100 at two sides of the p-GaN gate 106, therefore constituting a GaN device. Since the drain and source are not key points of the present invention, relevant description and drawing will be hereinafter omitted.

Figure 2:
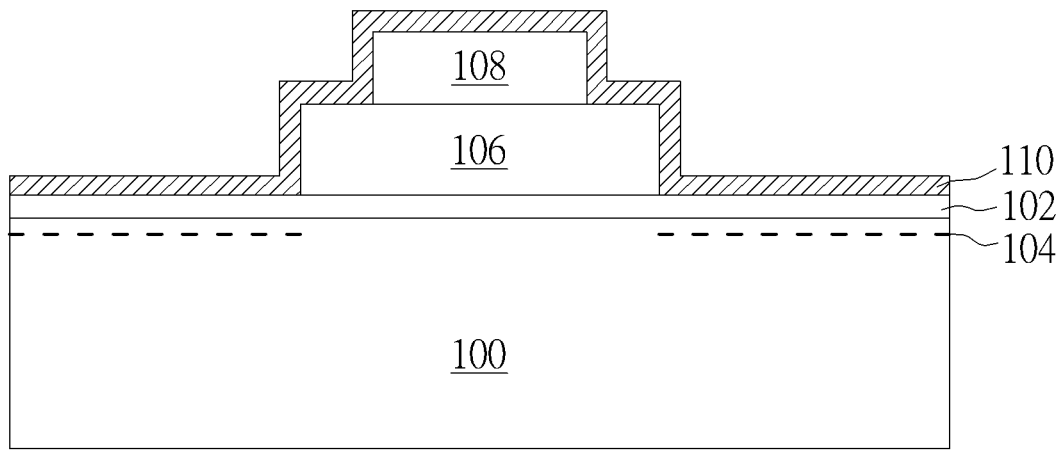

Please refer to FIG. 2. After the p-GaN gate 106 and TiN electrode 108 are formed, a conformal first dielectric layer 110 is formed on exposed surfaces of the AlGaN layer 102, p-GaN gate 106 and the TiN electrode 108. The material of first dielectric layer 110 may be aluminum oxide or aluminum nitride formed through atomic layer deposition (ALD) or silicon oxide through chemical vapor deposition (CVD), with thickness between 15-200 Å. In the embodiment of present invention, the first dielectric layer 110 may function as a mask for $N_2$ pre-treatment in later process.

Figure 3:
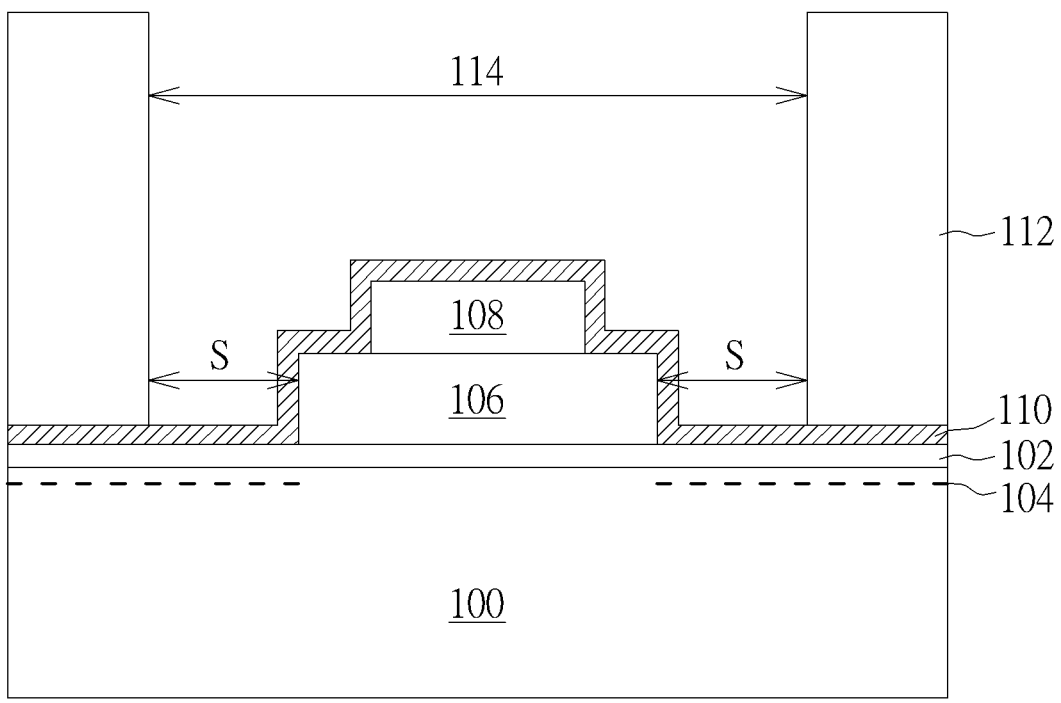

Please refer to FIG. 3. After the first dielectric layer 110 is formed, a photoresist 112 is then formed on the first dielectric layer 110, with an opening 114 formed therein through photolithography process. In the embodiment of present invention, generally, the opening 114 completely overlaps the p-GaN gate 106 in a direction vertical to the GaN substrate 100, wherein a horizontal spacing S is between the sidewall of opening 114 and the p-GaN gate 106, which is between 0.05-0.25 μm. The opening 114 of photoresist 112 may define predetermined regions subjected to the $N_2$ pre-treatment, i.e. the region of p-GaN gate 106 and surrounding regions as shown in the figure.

Figure 4:
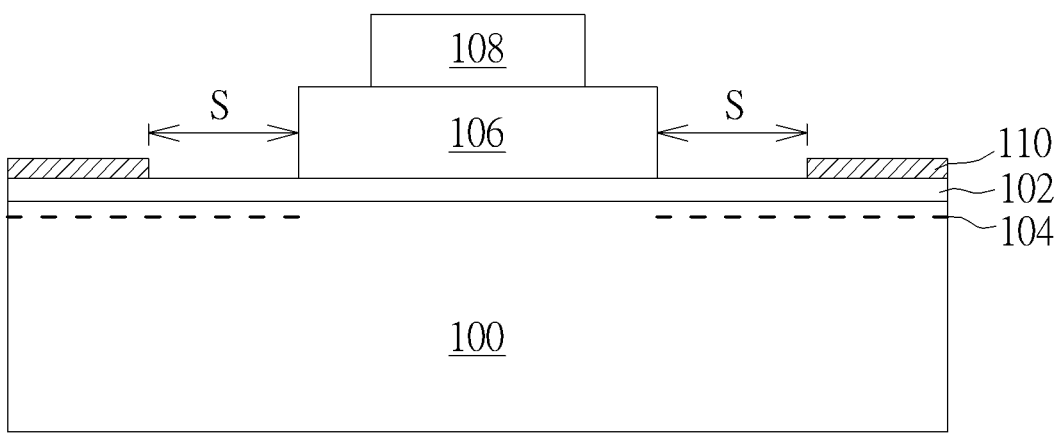

Please refer to FIG. 4. After the photoresist 112 is formed, an etching process is then performed using the photoresist 112 as an etch mask to remove exposed first dielectric layer 110. The photoresist 112 is then removed after the etching process. It is shown in the figure that the first dielectric layer 110 is patterned after the etching process, so that it will only be on the AlGaN layer 102 around the p-GaN gate 106. The first dielectric layer 110 partially overlaps the 2DEG channel 104 in vertical direction, and a horizontal spacing S is formed between the first dielectric layer 110 and the p-GaN gate 106. In this way, the first dielectric layer 110 may function as a mask in the $N_2$ pre-treatment later to confine the predetermined treatment regions at gates and their surrounding regions.

Figure 5:
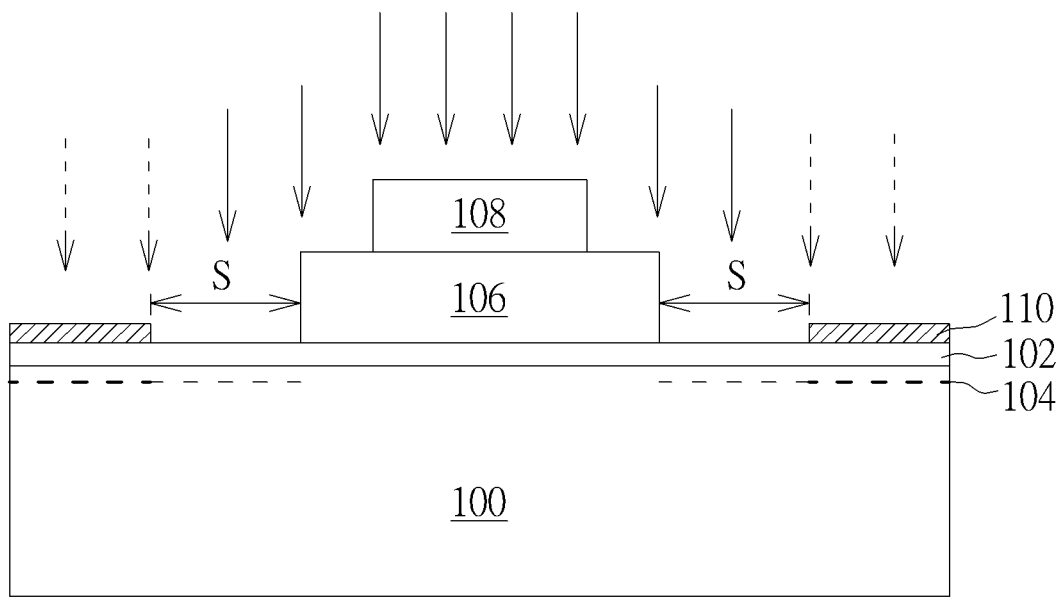

Please refer to FIG. 5. After the first dielectric layer 110 is patterned, using the remaining first dielectric layer 110 as a mask to perform a $N_2$ pre-treatment to the interface between the AlGaN layer 102 and GaN substrate 100 not covered by the first dielectric layer 110 (i.e. the position of 2DEG channel 104). In the embodiment of present invention, the $N_2$ pre-treatment may be a plasma nitriding treatment, wherein the introduced nitrogen is decomposed into nitrogen negative ions ($N^-$) that permeate into the position of 2DEG channel 104. The permeating nitrogen ions will react and bond with the gallium ion ($Ga^+$) and aluminum ions ($Al^+$) there to reduce the density of 2DEG channel 104 that may be produced there, thereby effectively solving the abnormal hump effect of $I_d$-$V_{gs}$ (drain current versus gate-source voltage) curve. The plasma power applied in the $N_2$ pre-treatment may be between 10-50 W, the gas flow of nitrogen applied in the $N_2$ pre-treatment may be between 20-200 sccm, and the duration of $N_2$ pre-treatment may be between 10-60 sec.

In another aspect of the embodiment of present invention, as shown in FIG. 5, since the specific patterned first dielectric layer 110 is used as a mask in the $N_2$ pre-treatment, only gates and surrounding regions will be subject to the $N_2$ pre-treatment, therefore avoiding excess nitrogen ions introduced into the heterogeneous interface of non-gate regions that causes the reduction of density of 2DEG channel 104 and the increase of channel resistance ($R_S$). Furthermore, in comparison to the approach of performing $N_2$ pre-treatment only to the gate regions, performing the $N_2$ pre-treatment to the regions surrounding the gates defined by the horizontal spacing S may also reduce the density of 2DEG channel 104 of the surrounding regions, there may solve the problem of abnormal hump effect of $I_d$-$V_{gs}$ curve more effectively, which is one advantage of the present invention.

Figure 6:
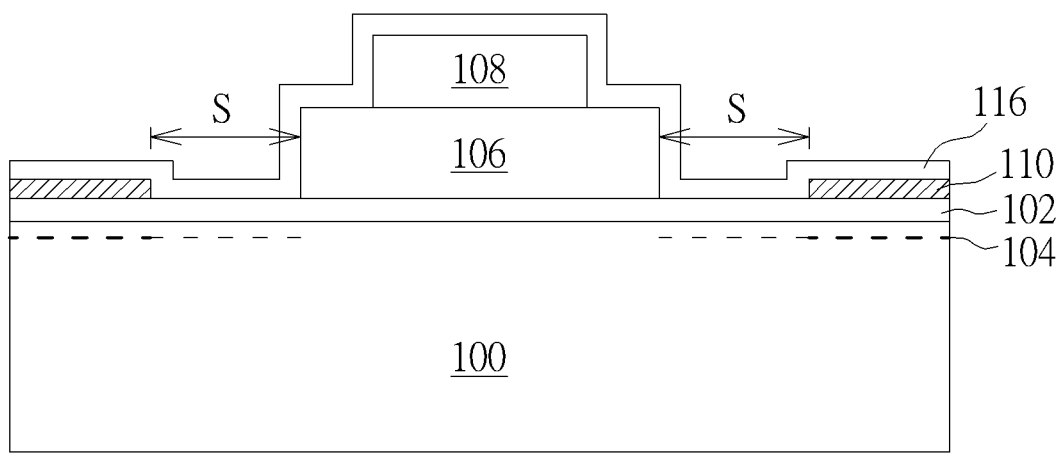

Please refer to FIG. 6. After the $N_2$ pre-treatment, a conformal second dielectric layer 116 is then formed on the first dielectric layer 110, AlGaN layer 102, p-GaN gate 106 and the TiN electrode 108. In the embodiment of present invention, the second dielectric layer 116 functions as a passivation layer to provide protection and isolation effect for the parts like gate, source/drain of the GaN device, in order to reduce current leakage. In the embodiment of present invention, the material of second dielectric layer 116 may be aluminum oxide or aluminum nitride through ALD, with thickness between 15-200 Å.

According to the process embodiment above, the present invention hereby also provides a novel GaN device, as shown in FIG. 6, with structures including a GaN substrate 100, an AlGaN layer 102 covering the GaN substrate 100, a p-GaN gate 106 on the AlGaN layer 102, a TiN electrode 108 on the p-GaN gate 106, a first dielectric layer 110 on the AlGaN layer 102 around the p-GaN gate 106, wherein a horizontal spacing S is between the first dielectric layer 110 and the p-GaN gate 106, and the interface between the AlGaN layer 102 and the GaN substrate 106 not covered by the first dielectric layer 110 is subject to the $N_2$ pre-treatment, and a second dielectric layer 116 covering and directly contacting the exposed first dielectric layer 110, AlGaN layer 102, p-GaN gate 106 and the TiN electrode 108.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A GaN device with $N_2$ pre-treatment, comprising:
    a GaN substrate;
    an AlGaN layer, covering said GaN substrate;
    a p-GaN gate on said AlGaN layer;
    a TiN electrode on said p-GaN gate;
    a first dielectric layer on said AlGaN layer around said p-GaN gate, wherein a horizontal spacing is between said first dielectric layer and said p-GaN gate, and an interface between said AlGaN layer and said GaN substrate not covered by said first dielectric layer is subject to $N_2$ pre-treatment; and
    a second dielectric layer, covering and directly contacting exposed said first dielectric layer, said AlGaN layer, said p-GaN gate and said TiN electrode.

2. The GaN device with $N_2$ pre-treatment of claim 1, wherein a material of said first dielectric layer is aluminum oxide, aluminum nitride or silicon oxide.

3. The GaN device with $N_2$ pre-treatment of claim 1, wherein a thickness of said first dielectric layer is between 15-200 Å.

4. The GaN device with $N_2$ pre-treatment of claim 1, wherein a material of said second dielectric layer is aluminum oxide or aluminum nitride.

5. The GaN device with $N_2$ pre-treatment of claim 1, wherein a thickness of said second dielectric layer is between 15-200 Å.

6. The GaN device with $N_2$ pre-treatment of claim 1, wherein said horizontal spacing is between 0.05-0.25 μm.

7. A method of performing $N_2$ pre-treatment to GaN device, comprising:
provid a GaN device, comprising a GaN substrate, an AlGaN layer covering said GaN substrate, a p-GaN gate on said AlGaN layer and a TiN electrode on said p-GaN gate;
forming a conformal first dielectric layer on said AlGaN layer, said p-GaN gate and said TiN electrode;
forming a photoresist on said first dielectric layer, and said photoresist is provided with an opening completely overlapping said p-GaN gate in a direction vertical to said GaN substrate, wherein a horizontal spacing is between a sidewall of said opening and said p-GaN gate;
performing an etching process to remove said first dielectric layer exposed from said photoresist;
removing said photoresist; and
using remaining said first dielectric layer as a mask to perform a $N_2$ pre-treatment to an interface between said AlGaN layer and said GaN substrate not covered by said first dielectric layer.

8. The method of performing $N_2$ pre-treatment to GaN device of claim 7, wherein a material of said first dielectric layer is aluminum oxide or aluminum nitride formed through atomic layer deposition (ALD) or silicon oxide formed through chemical vapor deposition (CVD).

9. The method of performing $N_2$ pre-treatment to GaN device of claim 7, further comprising forming a second dielectric layer on said first dielectric layer, said AlGaN layer, said p-GaN gate and said TiN electrode after said $N_2$ pre-treatment.

10. The method of performing $N_2$ pre-treatment to GaN device of claim 9, wherein a material of said second dielectric layer is aluminum oxide or aluminum nitride formed through atomic layer deposition (ALD).

11. The method of performing $N_2$ pre-treatment to GaN device of claim 7, wherein a plasma power applied in said $N_2$ pre-treatment is 10-50 W, a gas flow of nitrogen applied in said $N_2$ pre-treatment is 20-200 sccm, and a duration applied of said $N_2$ pre-treatment is 10-60 s.

12. The method of performing Ne pre-treatment to GaN device of claim 7, wherein said horizontal spacing is 0.05-0.25 μm.

* * * * *